US011591694B2

(12) United States Patent
Hiramatsu et al.

(10) Patent No.: US 11,591,694 B2
(45) Date of Patent: Feb. 28, 2023

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: KOKUSAI ELECTRIC CORPORATION, Tokyo (JP)

(72) Inventors: Hiroaki Hiramatsu, Toyama (JP); Shinya Ebata, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 176 days.

(21) Appl. No.: 17/137,034

(22) Filed: Dec. 29, 2020

(65) Prior Publication Data
US 2021/0115563 A1 Apr. 22, 2021

Related U.S. Application Data

(63) Continuation of application No. 16/136,999, filed on Sep. 20, 2018, now Pat. No. 10,907,253.

(30) Foreign Application Priority Data

Oct. 13, 2017 (JP) .............. JP2017-199502

(51) Int. Cl.
*H01L 21/228* (2006.01)
*C23C 16/52* (2006.01)
(Continued)

(52) U.S. Cl.
CPC .............. *C23C 16/52* (2013.01); *C23C 16/345* (2013.01); *C23C 16/4586* (2013.01);
(Continued)

(58) Field of Classification Search
CPC ........... H01L 21/0217; H01L 21/02211; H01L 21/02271; H01L 21/0228; H01L 21/67017;
(Continued)

(56) References Cited

U.S. PATENT DOCUMENTS

2009/0197424 A1 8/2009 Sakai et al.
2013/0252439 A1* 9/2013 Hirose .............. H01L 21/02211
118/704

(Continued)

FOREIGN PATENT DOCUMENTS

JP 2010-118462 A 5/2010
JP 2013-225660 A 10/2013
(Continued)

OTHER PUBLICATIONS

Japanese Office Action dated Dec. 17, 2019 for the Japanese Patent Application No. 2017-199502.
(Continued)

*Primary Examiner* — Mounir S Amer
*Assistant Examiner* — Alexander Belousov
(74) *Attorney, Agent, or Firm* — Volpe Koenig

(57) ABSTRACT

A method includes forming a film on a substrate by performing a cycle a predetermined number of times, the cycle including non-simultaneously performing: (a) forming a first layer by supplying a precursor to the substrate; and (b) forming a second layer by supplying a reactant to the substrate and modifying the first layer. The (a) includes: (a-1) supplying the precursor to the substrate from a first supply part while supplying an inert gas at a first flow rate, and supplying an inert gas at a second flow rate from a second supply part; and (a-2) supplying the precursor to the substrate while supplying the inert gas at a third flow rate from the first supply part, or supplying the precursor from
(Continued)

the first supply part while stopping the supply of the inert gas, and supplying the inert gas at a fourth flow rate from the second supply part.

22 Claims, 7 Drawing Sheets

(51) Int. Cl.
  | | |
  |---|---|
  | *H01L 21/67* | (2006.01) |
  | *C23C 16/455* | (2006.01) |
  | *H01L 21/02* | (2006.01) |
  | *H01L 21/66* | (2006.01) |
  | *C23C 16/458* | (2006.01) |
  | *C23C 16/34* | (2006.01) |

(52) U.S. Cl.
  CPC .. *C23C 16/45502* (2013.01); *C23C 16/45546* (2013.01); *C23C 16/45563* (2013.01); *C23C 16/45578* (2013.01); *H01L 21/0217* (2013.01); *H01L 21/0228* (2013.01); *H01L 21/02211* (2013.01); *H01L 21/02271* (2013.01); *H01L 21/67017* (2013.01); *H01L 21/67109* (2013.01); *H01L 21/67248* (2013.01); *H01L 21/67253* (2013.01); *H01L 22/12* (2013.01)

(58) Field of Classification Search
  CPC ......... H01L 21/67109; H01L 21/67248; H01L 21/67253; H01L 22/12
  See application file for complete search history.

(56) References Cited

U.S. PATENT DOCUMENTS

| | | | |
|---|---|---|---|
| 2016/0097126 A1* | 4/2016 | Kogura | ............... H01L 21/0214 118/704 |
| 2016/0284539 A1 | 9/2016 | Horita et al. | |
| 2017/0298508 A1 | 10/2017 | Yamakoshi et al. | |
| 2019/0040279 A1 | 2/2019 | Khandelwal | |

FOREIGN PATENT DOCUMENTS

| | | |
|---|---|---|
| JP | 2016-072587 A | 5/2016 |
| JP | 2016-181545 A | 10/2016 |
| WO | 2016/110956 A1 | 7/2016 |

OTHER PUBLICATIONS

Singaporean Search Report and Written Opinion dated May 17, 2019 for the Signaporean Patent Application No. 10201806148Q.
Singapore Search Report dated Apr. 15, 2021 for Singapore Patent Application No. 10202004551X.
Singapore Written Opinion dated Apr. 15, 2021 for Singapore Patent Application No. 10202004551X.

* cited by examiner

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATION

This application is a continuation application of U.S. patent application Ser. No. 16/136,999 filed on Sep. 20, 2018 which claims the benefit of priority from Japanese Patent Application No. 2017-199502, filed on Oct. 13, 2017, the entire contents of which are incorporated herein by reference.

TECHNICAL FIELD

The present disclosure relates to a method of manufacturing a semiconductor device, a substrate processing apparatus and a non-transitory computer-readable recording medium.

BACKGROUND

As one of various processes of manufacturing a semiconductor device, a process of forming a film on a substrate is performed.

SUMMARY

The present disclosure provides some embodiments of a technique capable of controlling a substrate in-pane film thickness distribution of a film formed on a substrate.

According to one embodiment of the present disclosure, there is provided a technique that includes: forming a film on a substrate by performing a cycle a predetermined number of times, the cycle including non-simultaneously performing: forming a first layer by supplying a precursor to the substrate; and forming a second layer by supplying a reactant to the substrate and modifying the first layer, wherein (a) includes: (a-1) supplying the precursor to the substrate from a first supply part while supplying an inert gas to the substrate at a first flow rate from the first supply part, and supplying an inert gas to the substrate at a second flow rate from a second supply part installed adjacent to the first supply part; and subsequently, (a-2) supplying the precursor to the substrate from the first supply part while supplying the inert gas to the substrate at a third flow rate smaller than each of the first flow rate and the second flow rate from the first supply part, or supplying the precursor to the substrate from the first supply part while stopping the supply of the inert gas to the substrate from the first supply part, and supplying the inert gas to the substrate at a fourth flow rate from the second supply part.

DETAILED DESCRIPTION

One Embodiment of the Present Disclosure

One embodiment of the present disclosure will now be described with reference to FIGS. 1 to 5.

(1) Configuration of Substrate Processing Apparatus

Figure 1:
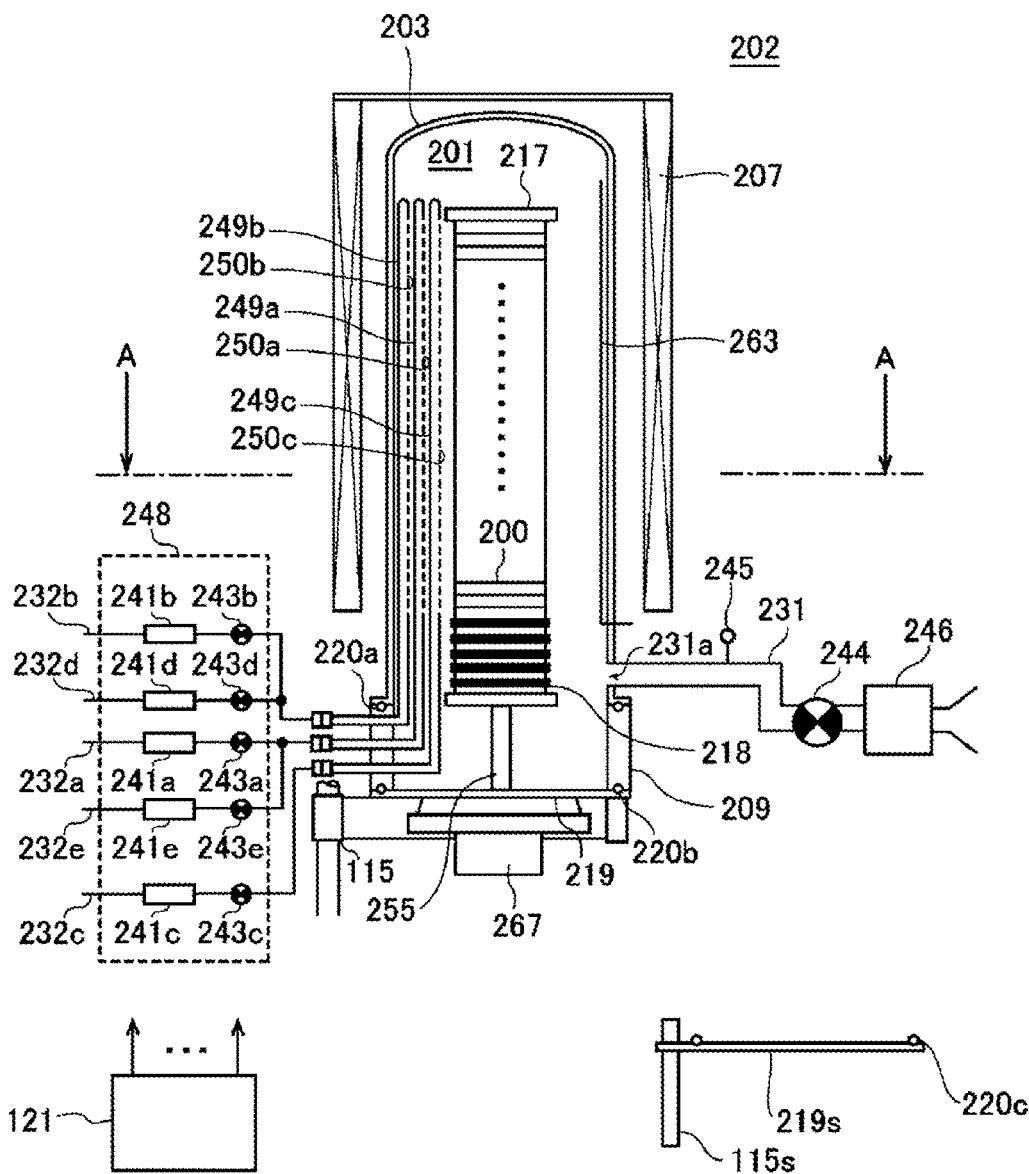
FIG. 1 is a schematic configuration diagram of a vertical process furnace of a substrate processing apparatus suitably used in an embodiment of the present disclosure, in which a portion of the process furnace is shown in a vertical sectional view.

As shown in FIG. 1, a process furnace 202 includes a heater 207 as a heating mechanism (temperature adjustment part). The heater 207 has a cylindrical shape and is vertically installed while being supported by a holding plate. The heater 207 also functions as an activation mechanism (excitation part) that thermally activates (excites) a gas.

A reaction tube 203 is arranged inside the heater 207 in a concentric relationship with the heater 207. The reaction tube 203 is made of a heat-resistant material such as, for example, quartz ($SiO_2$) or silicon carbide (SiC) and is formed in a cylindrical shape with its upper end closed and its lower end opened. A manifold 209 is disposed below the reaction tube 203 in a concentric relationship with the reaction tube 203. The manifold 209 is made of a metallic material such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O-ring 220a as a seal member is installed between the manifold 209 and the reaction tube 203. The reaction tube 203 is vertically installed just like the heater 207. A process vessel (reaction vessel) is mainly composed of the reaction tube 203 and the manifold 209. A process chamber 201 is formed in a hollow portion of the process vessel. The process chamber 201 is configured to accommodate wafers 200 as substrates. The wafers 200 are subjected to a process inside the process chamber 201.

A nozzle 249a as a first supply part and nozzles 249b and 249c as a second supply part are installed so as to penetrate a side wall of the manifold 209 inside the process chamber 201. Gas supply pipes 232a to 232c are connected to the nozzles 249a to 249c, respectively. The second supply part is different from the first supply part and is installed adjacent to the first supply part. The nozzles 249a, 249b and 249c are different from each other. The nozzles 249b and 249c are installed adjacent to the nozzle 249a.

Mass flow controllers (MFCs) 241a to 241c as flow rate controllers (flow rate control parts) and valves 243a to 243c as opening/closing valves are installed in the gas supply pipes 232a to 232c in order from the upstream side of a gas flow, respectively. Gas supply pipes 232e and 232d are connected to the gas supply pipes 232a and 232b, respectively, at the downstream side of the valves 243a and 243b. MFCs 241e and 241d and valves 243e and 243d are installed in the gas supply pipes 232e and 232d sequentially from the upstream side of a gas flow.

Figure 2:
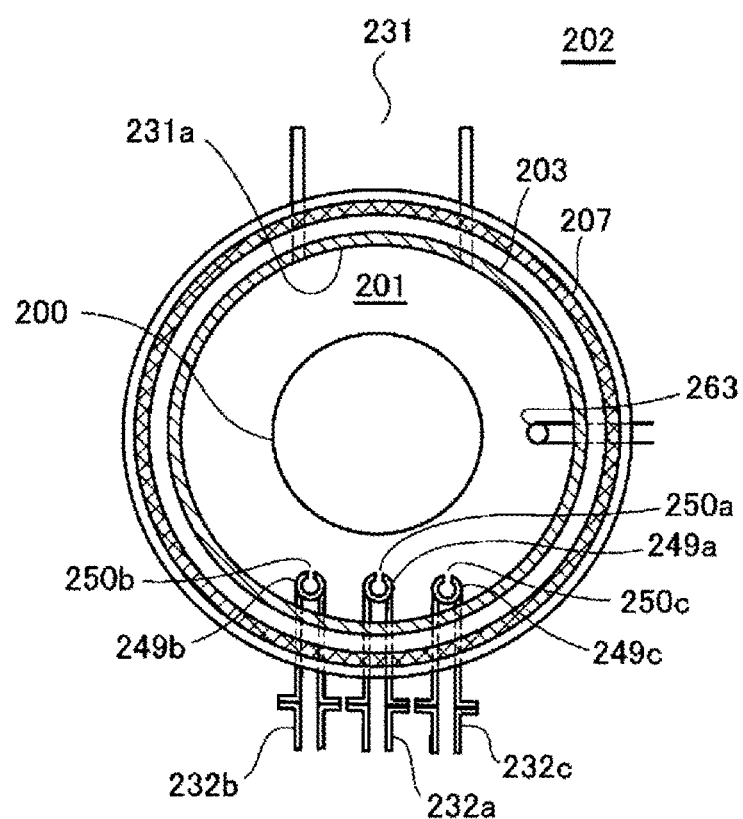
FIG. 2 is a schematic configuration diagram of a portion of the vertical process furnace of the substrate processing apparatus suitably used in an embodiment of the present disclosure, in which the portion of the process furnace is shown in a sectional view taken along line A-A in FIG. 1.

As shown in FIG. 2, the nozzles 249a to 249c are arranged in an annular space in a plan view between an inner wall of the reaction tube 203 and the wafers 200 and are installed so as to extend upward in an arrangement direction of the wafers 200 from the lower portion of the inner wall of the reaction tube 203 to the upper portion thereof. In other words, the nozzles 249a to 249c are respectively installed in a region defined at the side of a wafer arrangement region where the wafers 200 are arranged, and horizontally surrounding the wafer arrangement region, so as to extend along the wafer arrangement region. In a plan view, the nozzle 249a is disposed so as to face an exhaust port 231a (to be described later) on a straight line across the centers of the wafers 200 loaded into the process chamber 201. The nozzles 249b and 249c are arranged so as to sandwich the nozzle 249a from both sides thereof. That is to say, the nozzles 249b and 249c are arranged along the inner wall of the reaction tube 203 (outer peripheral portions of the wafers 200) so as to sandwich the nozzle 249a from both sides thereof. Gas supply holes 250a to 250c for supplying gases are formed in side surfaces of the nozzles 249a to 249c, respectively. The respective gas supply holes 250a to 250c are opened so as to face the exhaust port 231a and are capable of supplying gases toward the wafers 200. The gas supply holes 250a to 250c are formed in plural locations corresponding to a region spanning from the lower portion to the upper portion of the reaction tube 203.

A precursor (precursor gas), for example, a halosilane-based gas containing Si, which is a predetermined element (main element) constituting a film, and a halogen element, is introduced from the gas supply pipe 232a into the process chamber 201 via the MFC 241a, the valve 243a and the nozzle 249a. The precursor gas refers to a gaseous precursor, for example, a gas obtained by vaporizing a precursor staying in a liquid state under room temperature and atmospheric pressure, a gaseous precursor under room temperature and atmospheric pressure, or the like. Halosilane refers to a silane having halogen groups. Halogen groups include a chloro group, a fluoro group, a bromo group, an iodo group, and the like. That is to say, halogen groups include halogen elements such as chlorine (Cl), fluorine (F), bromine (Br), iodine (I), and the like. As the halosilane-based gas, for example, a precursor gas containing Si and Cl, namely a chlorosilane-based gas may be used. The chlorosilane-based gas acts as a Si source. As the chlorosilane-based gas, for example, a hexachlorodisilane ($Si_2Cl_6$, abbreviation: HCDS) gas may be used.

From the gas supply pipe 232b, a reactant having a chemical structure (molecular structure) different from that of the precursor, for example, a hydrogen-nitride-based gas which is a nitriding gas as a nitrogen (N)-containing gas, is supplied into the process chamber 201 via the MFC 241b, the valve 243b and the nozzle 249b. The hydrogen-nitride-based gas acts as an N source. For example, an ammonia ($NH_3$) gas may be used as the hydrogen-nitride-based gas.

From the gas supply pipes 232c to 232e, an inert gas, for example, a nitrogen ($N_2$) gas is supplied into the process chamber 201 via the MFCs 241c to 241e, the valves 243c to 243e, the gas supply pipes 232c to 232a and the nozzles 249c to 249a. The $N_2$ gas acts as a purge gas, a carrier gas or a dilution gas and further acts as a film thickness distribution control gas for controlling the in-plane film thickness distribution of the films formed on the wafers 200.

A precursor supply system is mainly constituted by the gas supply pipe 232a, the MFC 241a and the valve 243a. A reactant supply system is mainly constituted by the gas supply pipe 232b, the MFC 241b and the valve 243b. An inert gas supply system is mainly constituted by the gas supply pipes 232c to 232e, the MFCs 241c to 241e and the valves 243c to 243e.

One or all of the above-mentioned various supply systems may be configured as an integrated supply system 248 formed by integrating the valves 243a to 243e, the MFCs 241a to 241e and the like. The integrated supply system 248 is connected to each of the gas supply pipes 232a to 232e and is configured so that the supply operations of the various gases to the gas supply pipes 232a to 232e, namely the opening/closing operation of the valves 243a to 243e, the flow rate adjusting operation of the MFCs 241a to 241e, and the like can be controlled by the controller 121 which will be described later. The integrated supply system 248 is a single integrated unit or divided integrated units. The integrated supply system 248 may be attached to and detached from the gas supply pipes 232a to 232e or the like on an integrated unit basis. The maintenance, replacement, expansion or the like of the integrated supply system 248 may be performed on an integrated unit basis.

An exhaust port 231a for exhausting an internal atmosphere of the process chamber 201 therethrough is formed in the lower portion of the side wall of the reaction tube 203. As shown in FIG. 2, the exhaust port 231a is formed at a position opposite (facing) the nozzles 249a to 249c (the gas supply holes 250a to 250c) across the wafers 200 in a plan view. The exhaust port 231a may be formed to extend from the lower portion to the upper portion of the side wall of the reaction tube 203, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) for detecting an internal pressure of the process chamber 201 and an APC (Auto Pressure Controller) valve 244 as a pressure regulator (pressure regulation part). The APC valve 244 is configured so that the vacuum exhaust of the interior of the process chamber 201 and the stop of the vacuum exhaust can be performed by opening and closing the APC valve 244 in a state in which the vacuum pump 246 is operated, and so that the internal pressure of the process chamber 201 can be adjusted by adjusting a valve opening degree based on the pressure information detected by the pressure sensor 245 in a state in which the vacuum pump 246 is operated. An exhaust system is mainly constituted by the exhaust pipe 231, the APC valve 244 and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of a metallic material such as, for example, SUS or the like, and is formed in a disc shape. An O-ring 220b as a seal member which makes contact with the lower end of the manifold 209 is installed on the seal cap 219. A rotation mechanism 267 for rotating a boat 217 to be described later is installed below the seal cap 219. A rotation shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. A shutter 219s is installed below the manifold 209 The shutter 219s functions as a furnace opening lid capable of airtightly closing the lower end opening of the manifold 209 in a state in which the seal cap 219 is lowered to unload the boat 217 from the process chamber 201. The shutter 219s is made of a metallic material such as, for example, SUS, and is formed in a disc shape. An O-ring 220c as a seal member which makes contact with the lower end of the manifold 209 is installed on the shutter 219s. The opening and closing operations (the elevating operation, the rotating operation and the like) of the shutter 219s are controlled by a shutter opening/closing mechanism 115s.

The boat 217 as a substrate support part is configured so as to support a plurality of, for example, 25 to 200 sheets of wafers 200 at multiple stages so that they are horizontally stacked with their centers concentrically aligned, namely so as to arrange the wafers 200 at intervals. The boat 217 is made of a heat-resistant material such as, for example, quartz or SiC. Heat insulating plates 218 made of a heat-resistant material such as, for example, quartz or SiC are disposed at multiple stages in a lower portion of the boat 217.

A temperature sensor 263 as a temperature detector is installed inside the reaction tube 203. By adjusting a state of supplying electric power to the heater 207 based on the temperature information detected by the temperature sensor 263, an internal temperature of the process chamber 201 is controlled to have a desired temperature distribution. The temperature sensor 263 is installed along the inner wall of the reaction tube 203.

Figure 3:
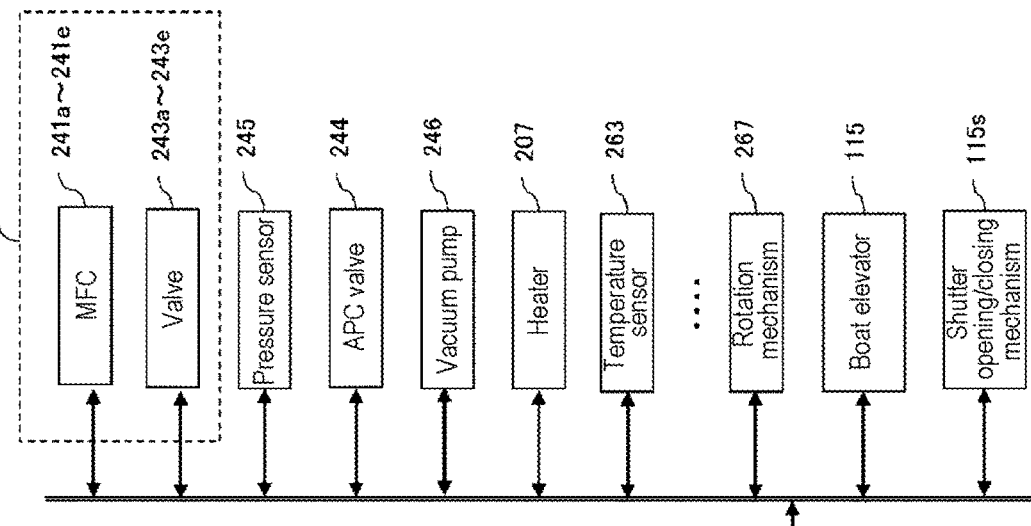
FIG. 3 is a schematic configuration diagram of a controller of the substrate processing apparatus suitably used in an embodiment of the present disclosure, in which a control system of the controller is shown in a block diagram.
Figure 3:
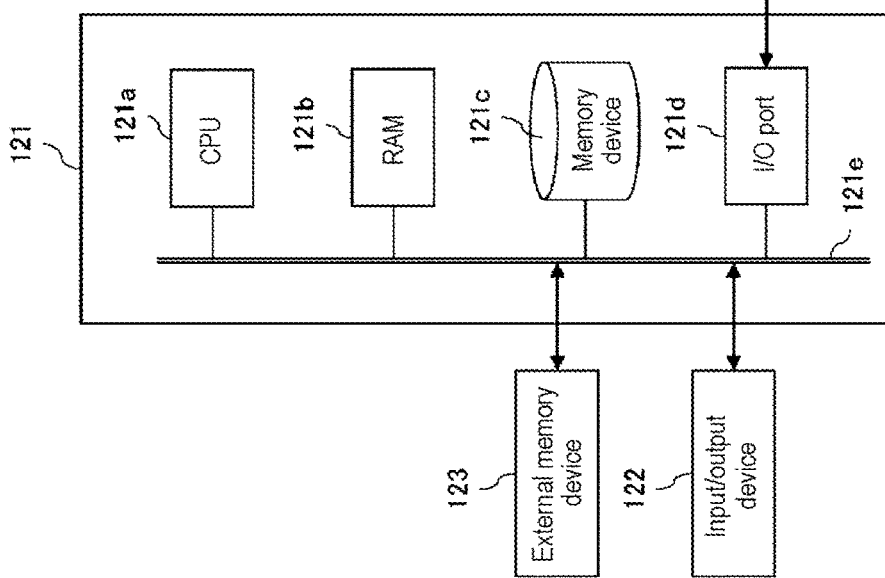

As shown in FIG. 3, the controller 121 as a control part (control means) is composed of a computer including a CPU (Central Processing Unit) 121a, a RAM (Random Access Memory) 121b, a memory device 121c and an I/O port 121d. The RAM 121b, the memory device 121c, and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which procedures and conditions of a substrate process (to be described later) are written, or the like is readably stored in the memory device 121c. The process recipe functions as a program for causing the controller 121 to execute each procedure of the below-mentioned substrate process to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily held.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the same. The CPU 121a is also configured to read the process recipe from the memory device 121c according to operation commands imputed by the input/output device 122. The CPU 121a is configured to control, according to the contents of the process recipe thus read, the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the opening/closing operation of the shutter 219s by the shutter opening/closing mechanism 115s, and the like.

The controller 121 may be configured by installing, on a computer, the aforementioned program stored in an external memory device 123. The external memory device 123 includes, for example, a magnetic disk such as a hard disk or the like, an optical disk such as a CD or the like, a magneto-optical disk such as an MO or the like, or a semiconductor memory such as a USB memory or the like. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed using a communication means such as the Internet or a dedicated line, instead of using the external memory device 123.

(2) Substrate Process

An example of a substrate processing sequence, i.e., a film-forming sequence, of forming a film on a wafer 200 as a substrate using the aforementioned substrate processing apparatus, which is one of various processes of manufacturing a semiconductor device, will be described with reference to FIG. 4. In the following descriptions, the operations of the respective parts that constitute the substrate processing apparatus are controlled by the controller 121.

Figure 4:
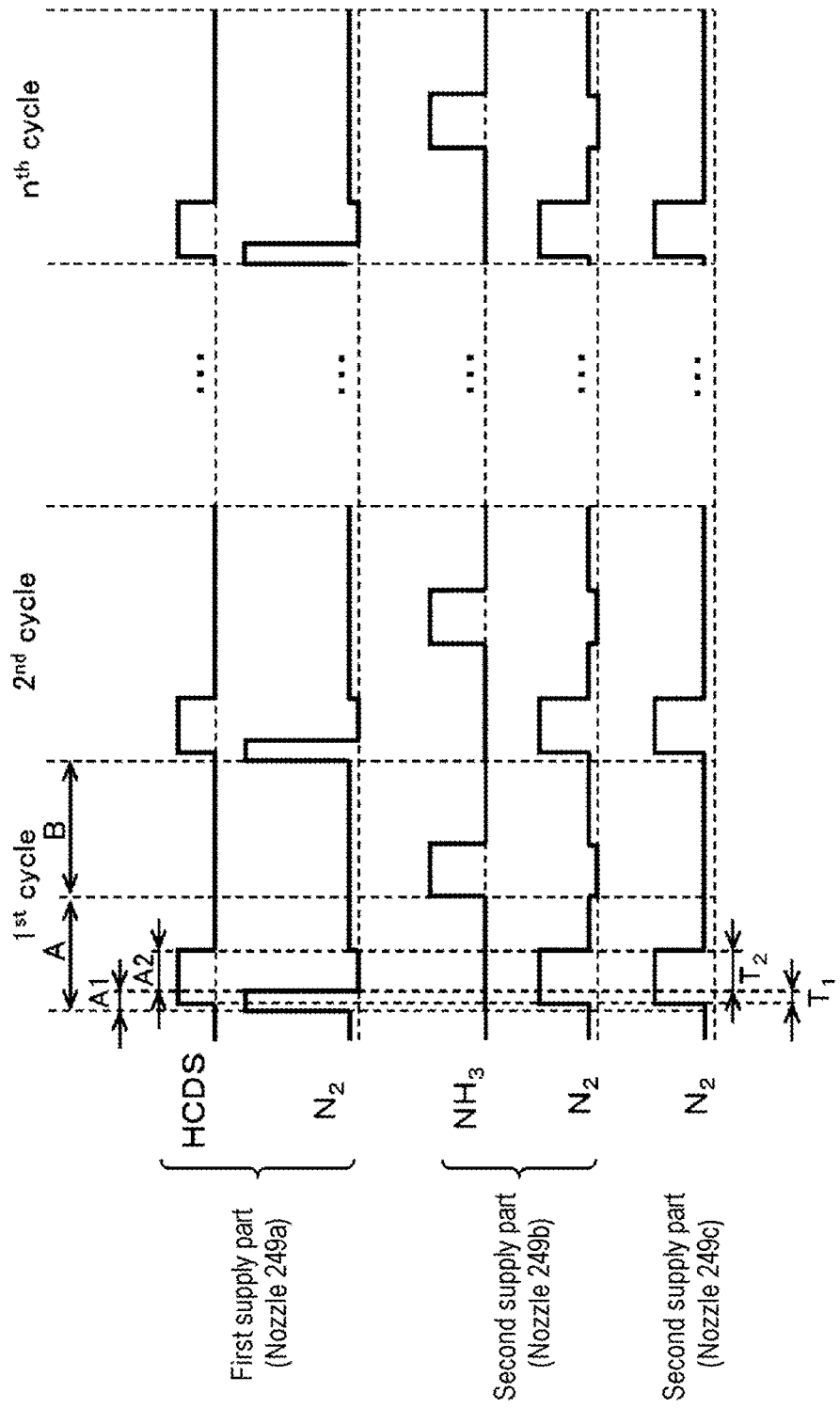
FIG. 4 is a diagram showing a film-forming sequence according to an embodiment of the present disclosure.

In a film-forming sequence shown in FIG. 4, a silicon nitride film (SiN film), which is a film containing Si and N, is formed on the wafer 200 by performing a cycle a predetermined number of times, the cycle including non-simultaneously performing:

step A (indicated by A in FIG. 4) of supplying a HCDS gas as a precursor to the wafer 200; and step B (indicated by B in FIG. 4) of supplying an $NH_3$ gas as a reactant to the wafer 200.

In step A of the film-forming sequence shown in FIG. 4, the wafer in-plane film thickness distribution (hereinafter also simply referred to as "in-plane film thickness distribution") of the SiN film formed on the wafer 200 is controlled by sequentially performing:

step A1 (indicated by A1 in FIG. 4) of supplying the HCDS gas to the wafer 200 while supplying an $N_2$ gas as an inert gas at a first flow rate from the nozzle 249a as the first supply part, and supplying the $N_2$ gas at a second flow rate from the nozzles 249b and 249c as the second supply part installed adjacent to the nozzle 249a; and step A2 (indicated by A2 in FIG. 4) of supplying the HCDS gas to the wafer 200 while supplying the $N_2$ gas at a third flow rate smaller than the first flow rate and the second flow rate from the nozzle 249a, and supplying an $N_2$ gas at a second flow rate from nozzles 249b and 249c as a second supply part installed adjacent to the nozzle 249a, or supplying the HCDS gas from the nozzle 249a while stopping the supply of the $N_2$ gas from the nozzle 249a, and supplying the $N_2$ gas at a fourth flow rate from the nozzles 249b and 249c.

Here, as an example, description will be made on a case where a bare wafer having a small surface area with no concave-convex structure formed on the surface thereof is used as the wafer 200, and the in-plane film thickness distribution of the SiN film is controlled by the film-forming sequence and the flow rate control so as to become a distribution (hereinafter also referred to as center convex distribution) in which the film thickness is largest in the central portion of the wafer 200 and is gradually reduced toward the outer peripheral portion (peripheral edge portion) of the wafer 200. If it is possible to form a film having a center convex distribution on the bare wafer, a film having a flat film thickness distribution (hereinafter also referred to as a flat distribution) with a small change in film thickness from the central portion to the outer peripheral portion can be formed on a patterned wafer (product wafer) having a large surface area with a fine concave-convex structure formed on the surface thereof.

Here, as an example, description will be made on a case where the first flow rate in step A1 is set to be larger than the second flow rate, the supply of the $N_2$ gas from the nozzle 249a is stopped (the third flow rate is set to zero) in step A2, and the fourth flow rate is set to be equal to the second flow rate.

In this specification, for the sake of convenience in description, the film-forming sequence shown in FIG. 4 may be denoted as follows. Similar notations are also used in the following descriptions of modifications and the like.

$(HCDS \rightarrow NH_3) \times n \Rightarrow SiN$

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Charging and Boat Loading)

If a plurality of wafers 200 is charged on the boat 217 (wafer charging), the shutter 219s is moved by the shutter opening/closing mechanism 115s to open the lower end opening of the manifold 209 (shutter open). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-exhausted (depressurization-exhausted) by the vacuum pump 246 so as to have a desired pressure (degree of vacuum). At this time, the internal pressure of the process chamber 201 is measured by the pressure sensor 245. The APC valve 244 is feedback-controlled based on the measured pressure information. The wafers 200 in the process chamber 201 are heated by the heater 207 to have a desired temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the process chamber 201 and the heating and rotation of the wafers 200 may be continuously performed at least until the process of the wafers 200 is completed.

(Film-Forming Step)

Thereafter, the following steps A and B are sequentially executed.

[Step A]

In this step, a HCDS gas is supplied to the wafers 200 in the process chamber 201.

Specifically, the valve 243a is opened to allow a HCDS gas to flow into the gas supply pipe 232a. The flow rate of the HCDS gas is adjusted by the MFC 241a. The HCDS gas is supplied into the process chamber 201 via the nozzle 249a and is exhausted from the exhaust port 231a. At this time, the HCDS gas is supplied to the wafers 200. In step A, steps A1 and A2 of supplying an $N_2$ gas into the process chamber 201 through the nozzles 249a to 249c are performed. Details thereof will be described later.

Excluding the supply conditions of the $N_2$ gas in steps A1 and A2 described later, examples of the process conditions in step A may be as follows.

Supply flow rate of HCDS gas: 0.001 to 2 slm, specifically 0.01 to 1 slm

Supply time of HCDS gas: 1 to 120 seconds, specifically 1 to 60 seconds

Process temperature: 250 to 800 degrees C., specifically 400 to 700 degrees C.

Process pressure: 1 to 2,666 Pa, specifically 67 to 1,333 Pa

By supplying the HCDS gas to the wafer 200 under the above-described conditions, a Si-containing layer containing Cl is formed as a first layer on the outermost surface of the wafer 200. The Si-containing layer containing Cl is formed as HCDS is physically adsorbed onto the outermost surface of the wafer 200, as a substance (hereinafter $Si_xCl_y$) generated by decomposition of a portion of HCDS is chemically adsorbed onto the outermost surface of the wafer 200, or as Si is deposited on the outermost surface of the wafer 200 due to thermal decomposition of HCDS. The Si-containing layer containing Cl may be an adsorption layer (physisorption layer or chemisorption layer) of HCDS or $Si_xCl_y$, or may be a Si layer containing Cl. In this specification, the Si-containing layer containing Cl is also simply referred to as a Si-containing layer.

Figure 5:
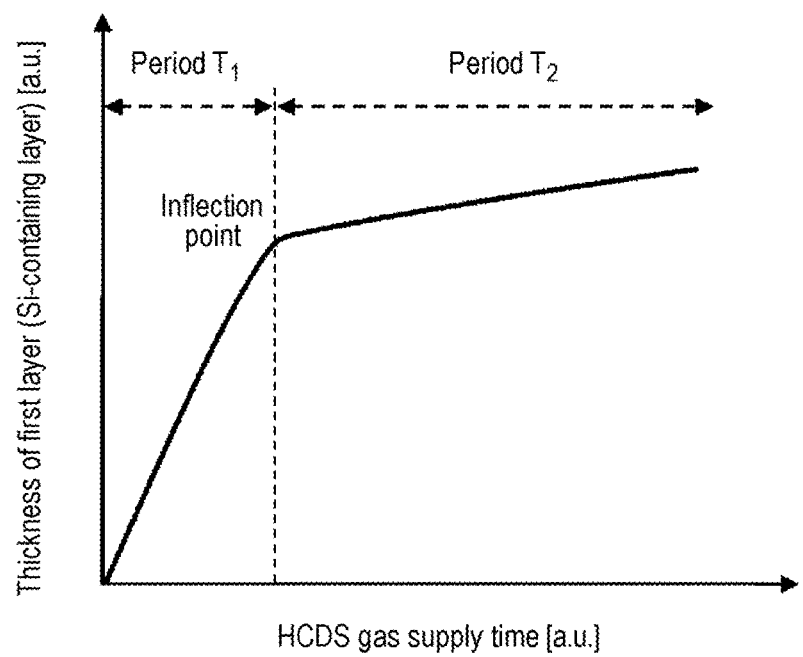
FIG. 5 is a view illustrating a change in a formation rate of a first layer on a substrate.

Si adsorption sites are abundantly present on the outermost surface of the wafer 200 before the supply of the HCDS gas. Therefore, as shown in FIG. 5, at the initial stage of supplying the HCDS gas, the first layer is formed at a relatively large formation rate. The relatively large formation rate is maintained for a predetermined period of time (period $T_1$). Thereafter, the formation of the first layer proceeds further by continuing the supply of the HCDS gas. As the number of the adsorption sites existing on the outermost surface of the wafer 200 decreases, a timing (inflection point) at which the formation rate of the first layer is greatly reduced occurs. After the occurrence of the inflection point, in a period of time (period $T_2$) until the adsorption of Si onto the outermost surface of the wafer 200 is completely saturated, the state in which the formation rate is greatly reduced is maintained. Hereinafter, the formation rate of the first layer in the period $T_1$ is also referred to as a first rate. The formation rate of the first layer in the period $T_2$ is also referred to as a second rate. The second rate is lower than the first rate (first rate>second rate).

According to the intensive research conducted by the inventors, it has been found that the supply of the HCDS gas to the wafer 200 needs to be continued for a long period of time in order to fully saturate the adsorption of Si onto the outermost surface of the wafer 200 after the supply of the HCDS gas to the wafer 200 is started and the aforementioned inflection point occurs. As one of the reasons, it is conceivable that steric hindrance formed on the surface of the wafer 200 may be eliminated during the film-forming process and Si may be adsorbed onto hidden adsorption sites. As another reason, it is also conceivable that the impurities adhering to the adsorption sites present on the surface of the wafer 200 and acting to inhibit adsorption of Si onto the adsorption sites may be desorbed during the film-forming process, and Si may be adsorbed onto the hidden adsorption sites. For these reasons, in order to fully saturate the adsorption of Si onto the wafer 200, it is necessary to continue the supply of the HCDS gas to the wafer 200 for a long period of time. Thus, the period $T_2$ becomes longer than the period $T_1$ ($T_1 < T_2$).

In this specification, the state during the aforementioned period $T_1$, namely the state in which the formation rate of the first layer is the first rate and the adsorption of Si contained in the HCDS gas to a base is unsaturated, will be referred to as a pseudo-unsaturated state. A period during which the adsorption of Si contained in the HCDS gas to a base is kept in a pseudo-unsaturated state will be referred to as a pseudo-unsaturated period. In addition, the state during the aforementioned period $T_2$, namely the state in which the formation rate of the first layer is the second rate and the adsorption of Si contained in the HCDS gas to a base is unsaturated but close to saturation, will be referred to as a pseudo-saturated state. A period during which the adsorption of Si contained in the HCDS gas to a base is kept in a pseudo-saturated state will be referred to as a pseudo-saturated period.

In the period $T_1$, the HCDS gas supplied from the nozzle 249a is actively consumed at the outer peripheral portion of the wafer 200 and tends not to reach the central portion of the wafer 200. Therefore, after the supply of the HCDS gas to the wafer 200 is started, for example, if the supply of the HCDS gas to the wafer 200 is stopped before the occurrence of the inflection point, the distribution of the thickness of the first layer in the plane of the wafer 200 (hereinafter also referred to as the in-plane thickness distribution of the first layer) becomes a distribution (hereinafter also referred to as center concave distribution) in which the thickness of the first layer is smallest in the central portion of the wafer 200 and is gradually increased toward the outer peripheral portion.

On the other hand, after the supply of the HCDS gas to the wafer 200 is started, for example, if the supply of the HCDS gas to the wafer 200 is continued for a long period of time even after the occurrence of the inflection point, the consumption of the HCDS gas at the outer peripheral portion of the wafer 200 is reduced. As a result, it is possible to gradually increase the amount of the HCDS gas reaching the central portion of the wafer 200. Therefore, as one method of bringing the in-plane thickness distribution of the first layer closer to the flat distribution from the center concave distribution, it is conceivable that the supply of the HCDS gas to the wafer 200 is continued for a long period of time without stopping the supply of the HCDS gas even after the occurrence of the inflection point.

However, in this method, the gas cost may be increased. Further, a required period of step A, i.e., a process time per cycle, namely the total process time may be increased. This may result in a decrease in productivity of the film-forming process. In this method, even if it is theoretically possible to bring the in-plane thickness distribution of the first layer closer to the flat distribution from the center concave distribution, it is difficult to bring the in-plane thickness distribution of the first layer to the center convex distribution.

In addition, when the HCDS gas is supplied to the wafer 200 in the period $T_1$ or $T_2$, the $N_2$ gas is simultaneously supplied from each of the nozzles 249b and 249c at a large flow rate, whereby an internal pressure of an annular space in a plan view (hereinafter simply referred to as "annular space") between the inner wall of the reaction tube 203 and the wafers 200 can be made larger than that in the case where the $N_2$ gas is not supplied from each of the nozzles 249b and 249c at a large flow rate. In this case, it is considered that the outflow of the HCDS gas to the annular space can be suppressed, and the supply amount of the HCDS gas to the central portion of the wafer 200 can be increased. Furthermore, in this case, it is also considered that a partial pressure (concentration) of the HCDS gas in the annular space can be lowered and the supply amount of the HCDS gas to the outer peripheral portion of the wafer 200 can be reduced. Therefore, as one method of bringing the in-plane thickness distribution of the first layer closer to the flat distribution or ultimately to the center convex distribution from the center concave distribution, it is conceivable that in the period $T_1$ or $T_2$, the $N_2$ gas is supplied from each of the nozzles 249b and 249c at a large flow rate, for example, at a flow rate larger than the flow rate of the HCDS gas.

However, in this method, the formation rate of the first layer is lowered due to excessive dilution of the HCDS gas, which may lead to a decrease in productivity of the film-forming process.

According to the intensive research conducted by the inventors, it has been found that, even if the supply of the $N_2$ gas from the nozzles 249b and 249c is controlled as described above in the period $T_1$ after the supply of the HCDS gas to the wafer 200 is started and before the inflection point occurs, it may be difficult to change the tendency that the HCDS gas is actively consumed at the outer peripheral portion of the wafer 200 and hardly reaches the central portion of the wafer 200 during the period $T_1$. For example, depending on the type of the precursor gas, even if the supply of the $N_2$ gas from the nozzles 249b and 249c in the period $T_1$ is controlled as described above, there is no change in the tendency that the in-plane thickness distribution of the first layer formed in the period $T_1$ becomes the center concave distribution. It has been found that it is difficult to bring the in-plane thickness distribution of the first layer to the flat distribution or the center convex distribution. As described above, with this method alone, the thickness distribution of the first layer may not be sufficiently controlled in some cases.

Furthermore, according to the intensive research conducted by the inventors, it has been found that, even if the supply of the $N_2$ gas from the nozzles 249b and 249c is controlled as described above in the period $T_2$ after the supply of the HCDS gas to the wafer 200 is started and the inflection point occurs, it may be difficult to change the in-plane thickness distribution of the first layer formed during the period $T_1$. For example, depending on the type of the precursor gas, even if the supply of the $N_2$ gas from the nozzles 249b and 249c in the period $T_2$ is controlled as described above, it is difficult to, in the period $T_2$, change the tendency of the in-plane thickness distribution of the first layer formed during the period $T_1$. It has been found that it is difficult to bring the in-plane thickness distribution of the first layer to the flat distribution or ultimately to the center convex distribution.

Therefore, in the present embodiment, in order to avoid the above-described various problems, in step A, steps A1 and A2 are performed in this order during the period from the start of the supply of the HCDS gas to the wafer 200 to the end of the supply of the HCDS gas to the wafer 200. More specifically, step A1 is performed during the above-described period $T_1$, namely a time period including the period until the formation rate of the first layer is changed from the first rate to the second rate smaller than the first rate (until the inflection point occurs). Furthermore, step A2 is performed during the above-described period $T_2$, namely the period after the formation rate of the first layer is changed from the first rate to the second rate smaller than the first rate (after the inflection point occurs). In order to enhance the controllability of the in-plane film thickness distribution of the SiN film formed on the wafer 200, it is effective not to perform step A2 during the period $T_1$. Since the period $T_1$ is shorter than the period $T_2$ as described above, the execution time of step A1 is shorter than the execution time of step A2.

Details of steps A1 and A2 will be described below in order.

In step A1, the valves 243e and 243a are opened to supply the HCDS gas to the wafer 200 while supplying the $N_2$ gas at a first flow rate from the nozzle 249a, and the valves 243d and 243c are opened to supply the $N_2$ gas at a second flow rate from the nozzles 249b and 249c installed adjacent to the nozzle 249a. As used herein, the term "second flow rate" refers to the total flow rate of the flow rates of the $N_2$ gases respectively supplied from the nozzles 249b and 249c. The flow rates of the $N_2$ gases supplied from the nozzles 249b and 249c may be substantially equal to each other.

In step A1, by controlling the supply of the $N_2$ gas from the nozzle 249a as described above, the $N_2$ gas supplied from the nozzle 249a is caused to act as a carrier gas, so that the HCDS gas supplied from the nozzle 249a can be pushed out from the outer peripheral portion of the wafer 200 to the central portion thereof. By virtue of this action, the amount of the HCDS gas reaching the central portion of the wafer 200 in step A1 can be made larger than the amount of the HCDS gas reaching the central portion of the wafer 200 in step A2 described later. Thus, the concentration of the HCDS gas at the central portion of the wafer 200 in step A1 can be made higher than the concentration of the HCDS gas at the central portion of the wafer 200 in step A2. In addition, by virtue of the above-described action, in step A1, the amount of the HCDS gas reaching the central portion of the wafer 200 can be made larger than the amount of the HCDS gas reaching the outer peripheral portion of the wafer 200. Thus, in step A1, the concentration of the HCDS gas at the central portion of the wafer 200 can be made higher than the concentration of the HCDS gas at the outer peripheral portion of the wafer 200. As a result, in step A1, the formation rate of the first layer at the central portion of the wafer 200 can be made larger than the formation rate of the first layer at the outer peripheral portion of the wafer 200. The in-plane thickness distribution of the first layer formed on the wafer 200 in the period $T_1$ can be brought to the flat distribution or ultimately to the center convex distribution rather than the center concave distribution.

In addition, in step A1, by controlling the supply of the $N_2$ gas from the nozzles 249b and 249c as described above, it is possible to make the internal pressure of the annular space larger than that when the aforementioned control is not performed, and it is possible to suppress the outflow of the HCDS gas to the annular space and to increase the supply amount of the HCDS gas to the central portion of the wafer 200. Furthermore, by controlling the supply of the $N_2$ gas from the nozzles 249b and 249c as described above, the flow of the $N_2$ gas supplied from the nozzles 249b and 249c toward the exhaust port 231a can be caused to act as a guide for guiding the HCDS gas and the like supplied from the nozzle 249a toward the central portion of the wafer 200. By virtue of this action, it is possible to increase the supply amount of the HCDS gas to the central portion of the wafer 200. It is also possible to lower the partial pressure of the HCDS gas in the annular space and to reduce the supply amount of the HCDS gas to the outer peripheral portion of the wafer 200. As a result, in step A1, the formation rate of the first layer at the central portion of the wafer 200 can be made larger than that of the first layer at the central portion of the wafer 200 when the supply of the $N_2$ gas from the nozzles 249b and 249c is not performed. Thus, it is possible to more reliably obtain the above-described action obtained by the $N_2$ gas supplied from the nozzle 249a, namely the effect of bringing the in-plane thickness distribution of the first layer formed on the wafer 200 to the flat distribution or ultimately to the center convex distribution.

In step A1, at least one of the first flow rate and the second flow rate, specifically both the first flow rate and the second flow rate, may be set to be larger than the supply flow rate of the HCDS gas in step A1. This makes it possible to more reliably obtain the above-described effect of bringing the in-plane thickness distribution of the first layer formed on the wafer 200 to the flat distribution or ultimately to the center convex distribution. Further, in step A1, at least one of the flow rates of the $N_2$ gases respectively supplied from the nozzles 249b and 249c, specifically both the flow rates of the $N_2$ gases, may be set to be larger than the supply flow rate of the HCDS gas in step A1. This makes it possible to more reliably obtain the above-described effect of bringing the in-plane thickness distribution of the first layer formed on the wafer 200 to the flat distribution or ultimately to the center convex distribution.

Further, in step A1, as shown in FIG. 4, the supply of the $N_2$ gas from the nozzle 249a may be started prior to the supply of the HCDS gas. That is to say, after generating a flow of the $N_2$ gas from the nozzle 249a toward the central portion of the wafer 200 in advance, the supply of the HCDS gas to the wafer 200 may be started. This makes it possible to reliably obtain the above-mentioned effect of causing the $N_2$ gas supplied from the nozzle 249a to act as a carrier gas immediately after starting the supply of HCDS. In addition, it is possible to prevent the concentration of the HCDS gas from transiently varying in the plane of the wafer 200 at the time of starting the supply of the HCDS gas. As a result, it is possible to control the in-plane thickness distribution of the first layer formed on the wafer 200 in the period $T_1$ with enhanced reproducibility in a reliable manner.

Examples of the process conditions in step A1 may be as follows.

First flow rate (nozzle 249a): 3 to 20 slm, specifically 5 to 10 slm

Second flow rate (total flow rate in nozzles 249b and 249c): 3 to 20 slm, specifically 5 to 10 slm Execution time of step A1: 1/10 to 1/4 of supply time of HCDS gas in step A Other process conditions are the same as the process conditions in step A described above.

In step A2, the MFC 241e is adjusted to supply the HCDS gas to the wafer 200 while supplying the $N_2$ gas at a third flow rate smaller than the first flow rate and the second flow rate from the nozzle 249a. Alternatively, the valve 243e is closed to supply the HCDS gas to the wafer 200 from the nozzle 249a while stopping the supply of the $N_2$ gas from the nozzle 249a, and the MFCs 241d and 241c are adjusted to supply the $N_2$ gas from the nozzles 249b and 249c at a fourth flow rate. As with the second flow rate, the term "third flow rate" used herein means the total flow rate of the flow rates of the $N_2$ gases respectively supplied from the nozzles 249b and 249c. The flow rates of the $N_2$ gases respectively supplied from the nozzles 249b and 249c may be substantially equal to each other. As described above, FIG. 4 shows, as an example, a case where the supply of the $N_2$ gas from the nozzle 249a is stopped (the third flow rate is set to zero) in step A2, and the fourth flow rate is set to be equal to the second flow rate (the fourth flow rate=the second flow rate).

In step A2, by controlling the supply of the $N_2$ gas from the nozzle 249a as described above, it is possible to suppress excessive dilution of the HCDS gas supplied to the wafer 200 from the nozzle 249a. As a result, the reduction in the formation rate of the first layer is suppressed, which makes it possible to avoid a reduction in productivity of the film-forming process. In the case of supplying the $N_2$ gas from the nozzle 249a in step A2 (when the third flow rate is not set to zero), the effect of causing the $N_2$ gas supplied from the nozzle 249a to act as a carrier gas as described in step A1 can be similarly obtained in step A2. However, even in this case, the third flow rate may be set to a flow rate smaller than the supply flow rate of the HCDS gas in step A2. Thus, it is possible to reliably obtain the above-described effect of suppressing the reduction in the formation rate of the first layer. In addition, in the case where the supply of the $N_2$ gas from the nozzle 249a is not performed (when the third flow rate is set to zero) in the step A2, it is possible to reliably obtain the above-described effect of suppressing the reduction in the formation rate of the first layer.

Further, in step A2, by controlling the supply of the $N_2$ gas from the nozzles 249b and 249c as described above, for the same reason as mentioned in step A1, it is possible to increase the supply amount of the HCDS gas to the central portion of the wafer 200 and to reduce the supply amount of the HCDS gas to the outer peripheral portion of the wafer 200. Furthermore, the effect mentioned in step A1, which is obtained by causing the flow of the $N_2$ gas supplied from the nozzles 249b and 249c toward the exhaust port 231a to act as a guide for guiding the HCDS gas supplied from the nozzle 249a toward the central portion of the wafer 200, can be similarly obtained in step A2 as well. In step A2, if the fourth flow rate is set to be larger than the supply flow rate of the HCDS gas in step A2, the effect mentioned in step A1, which is obtained by causing the $N_2$ gas supplied from the nozzles 249b and 249c to act as a guide for the HCDS gas, can be obtained more reliably.

Examples of the process conditions in step A2 may be as follows.

Third flow rate (nozzle 249a): 0 to 0.8 slm, specifically 0 to 0.2 slm

Fourth flow rate (total flow rate in nozzles 249b and 249c): 3 to 20 slm, specifically 5 to 10 slm Execution time of step A2: 3/4 to 9/10 of supply time of HCDS gas in step A Other process conditions are the same as the process conditions in step A described above.

After forming the first layer on the wafer 200, the valve 243a is closed to stop the supply of the HCDS gas into the process chamber 201. Then, the inside of the process chamber 201 is evacuated to remove the gas and the like remaining in the process chamber 201 from the inside of the process chamber 201. At this time, the valves 243c to 243e are opened to supply the $N_2$ gas into the process chamber 201 through the nozzles 249c to 249a. The $N_2$ gas supplied from the nozzles 249c to 249a acts as a purge gas, whereby the interior of the process chamber 201 is purged (purging step). In the purging step, each of the flow rates of the $N_2$ gases respectively supplied from the nozzles 249c to 249a is set to, for example, a flow rate falling within a range of 0.1 to 2 slm. Other process conditions are the same as the process conditions in step A described above.

As the precursor, in addition to the HCDS gas, it may be possible to use a chlorosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like.

As the inert gas, in addition to the $N_2$ gas, it may be possible to use a noble gas such as an Ar gas, a He gas, a Ne gas, a Xe gas or the like. This holds true in step B which will to be described later.

[Step B]

After step A is completed, an $NH_3$ gas is supplied to the wafer 200 in the process chamber 201, namely the first layer formed on the wafer 200. Specifically, the valve 243b is opened to allow an $NH_3$ gas to flow into the gas supply pipe 232b. The $NH_3$ gas, the flow rate of which is adjusted by the MFC 241b, is supplied to the process chamber 201 through the nozzle 249b and is exhausted from the exhaust port 231a. At this time, the $NH_3$ gas is supplied to the wafer 200. At this time, at least one of the valves 243c to 243e may be opened to supply the $N_2$ gas into the process chamber 201 through at least one of the nozzles 249c to 249a. FIG. 4 shows a case where the supply of the $N_2$ gas from the nozzle 249b is not performed and the supply of the $N_2$ gas from the nozzles 249a and 249c is performed.

Examples of the process conditions applied in this step may be as follows.

Supply flow rate of $NH_3$ gas: 1 to 10 slm

Supply time of $NH_3$ gas: 1 to 120 seconds, specifically 1 to 60 seconds

Supply flow rate of $N_2$ gas (per gas supply pipe): 0~2 slm

Process pressure: 1 to 4,000 Pa, specifically 1 to 3,000 Pa Other process conditions are the same as the process conditions in step A.

By supplying the $NH_3$ gas to the wafer 200 under the above-described conditions, at least a portion of the first layer formed on the wafer 200 is nitrided (modified). By the modification of the first layer, a second layer containing Si and N, namely a SiN layer is formed on the wafer 200. When forming the second layer, impurities such as Cl and the like contained in the first layer constitute a gaseous substance containing at least Cl in the course of the modifying reaction of the first layer using the $NH_3$ gas. The gaseous substance is discharged from the interior of the process chamber 20. As a result, the second layer becomes a layer having a smaller amount of impurities such as Cl and the like than the first layer.

After the second layer is formed, the valve 243b is closed to stop the supply of the $NH_3$ gas into the process chamber 201. Then, according to the same process procedures and process conditions as in the purging step of step A, the gas and the like remaining in the process chamber 201 are removed from the interior of the process chamber 201.

As the reactant, in addition to the $NH_3$ gas, it may be possible to use, for example, a hydrogen-nitride-based gas such as a diazene ($N_2H_2$) gas, a hydrazine ($N_2H_4$) gas, an $N_3H_8$ gas or the like.

(Performing a Predetermined Number of Times)

A SiN film having a predetermined composition and a predetermined film thickness can be formed on the wafer 200 by performing, a predetermined number of times (n times where n is an integer of one or more), a cycle which performs the above-described steps A and B non-simultaneously, namely without synchronization. The cycle described above may be repeated multiple times. That is to say, a thickness of the second layer formed when performing the above-described cycle once may be set to be smaller than a desired film thickness. The above-described cycle may be repeated multiple times until the film thickness of the SiN film formed by laminating the second layers reaches a desired film thickness.

(After-Purging and Atmospheric Pressure Restoration)

After the film-forming step is completed, the $N_2$ gas as a purge gas is supplied from each of the nozzles 249a to 249c into the process chamber 201 and is exhausted from the exhaust port 231a. As a result, the interior of the process chamber 201 is purged, and the gas or the reaction byproduct remaining in the process chamber 201 is removed from the process chamber 201 (after-purging). Thereafter, an internal atmosphere of the process chamber 201 is replaced by an inert gas (inert gas replacement), and the internal pressure of the process chamber 201 is restored to the atmospheric pressure (atmospheric pressure restoration).

(Boat Unloading and Wafer Discharging)

The seal cap 219 is lowered by the boat elevator 115 and the lower end of the manifold 209 is opened. Then, the processed wafers 200 are unloaded from the lower end of the manifold 209 outward of the reaction tube 203 in a state in which the processed wafers 200 are supported by the boat 217 (boat unloading). After the boat unloading, the shutter 219s is moved so that the lower end opening of the manifold 209 is sealed by the shutter 219s via the O-ring 220c (shutter closing). The processed wafers 200 are taken out outward of the reaction tube 203 and then discharged from the boat 217 (wafer discharging).

(3) Effects According to the Present Embodiment

According to the present embodiment, one or more effects described below may be achieved.

(a) In step A of supplying the HCDS gas to the wafer 200 to form the first layer, it is possible to control the in-plane thickness distribution of the first layer by performing the above-described steps A1 and A2. As a result, it becomes possible to enhance the controllability of the in-plane film thickness distribution of the SiN film formed on the wafer 200. For example, the in-plane film thickness distribution of the SiN film formed on the wafer 200 configured as a bare wafer can be set to a center convex distribution. Thus, when a patterned wafer is used as the wafer 200, it is possible to form a SiN film having a flat distribution on the wafer 200.

It is considered that the in-plane film thickness distribution of the film formed on the wafer 200 depends on a surface area of the wafer 200 due to a so-called loading effect. As the surface area of the wafer 200 to be subjected to film formation increases, a larger amount of precursor such as a HCDS gas or the like is consumed at the outer peripheral portion of the wafer 200, making it difficult for the precursor to reach the central portion of the wafer 200. As a result, the in-plane film thickness distribution of the film formed on the wafer 200 tends to become a center concave distribution. According to the present embodiment, even when a patterned wafer having a large surface area is used as the wafer 200, it is possible to correct the in-plane film thickness distribution of the film formed on the wafer 200 from a center concave distribution to a flat distribution or ultimately to a center convex distribution. Thus, it is possible to freely control the in-plane film thickness distribution of the film formed on the wafer 200.

(b) In step A of forming the first layer by supplying the HCDS gas to the wafer 200, by performing steps A1 and A2 described above, it is possible to control a distribution of the composition of the SiN layer in the plane of the wafer 200, namely a wafer in-plane composition distribution (hereinafter also referred to as in-plane composition distribution) of the SiN film formed on the wafer 200. As a result, it is possible to enhance the controllability of a wafer in-plane film quality distribution (hereinafter also referred to as in-plane film quality distribution) of the SiN film formed on the wafer 200.

For example, when the in-plane film thickness distribution of the SiN film formed on the wafer 200 is set to the center convex distribution, the composition of the film can be made Si-rich at the central portion of the wafer 200, and N-rich at the outer peripheral portion of the wafer 200. Furthermore, for example, when the in-plane film thickness distribution of the SiN film formed on the wafer 200 is set to the center concave distribution, the composition of the film can be made N-rich at the central portion of the wafer 200, and Si-rich at the outer peripheral portion of the wafer 200. In addition, for example, when the in-plane film thickness distribution of the SiN film formed on the wafer 200 is set to the flat distribution, it is possible to make uniform the composition of the film over the entire plane of the wafer 200.

As described above, in the present embodiment, by controlling the in-plane film thickness distribution of the SiN film formed on the wafer 200, it is possible to control the in-plane composition distribution of the SiN film formed on the wafer 200, namely the in-plane film quality distribution over a wide region. Thus, for example, it is possible to improve the in-plane uniformity thereof.

(c) In step A2, by controlling the supply of the $N_2$ gas from the nozzle 249a as described above, it is possible to reduce the degree of dilution of the HCDS gas and to suppress a decrease in the formation rate of the first layer. As a result, it is possible to suppress a decrease in the efficiency of the formation process of the first layer and to avoid a decrease in the productivity of the film-forming process.

Further, by making the execution time of step A1 shorter than the execution time of step A2, it is possible to more reliably suppress the decrease in the formation rate of the first layer. In other words, by setting the execution time of step A1 having a high degree of dilution of HCDS gas shorter than the execution time of step A2 having a small degree of dilution of HCDS gas, it is possible to suppress the overall reduction in the efficiency of the formation process of the first layer and to avoid the decrease in the productivity of the film-forming process.

(d) By performing steps A1 and A2 under the above-described process conditions, the partial pressure of the HCDS gas inside the process chamber 201 in step A1 can be made smaller than that of the HCDS gas inside the process chamber 201 in step A2. By lowering the partial pressure of the HCDS gas in step A1 in this way, it becomes possible to enhance the controllability of the in-plane thickness distribution of the first layer formed in step A1. As described above, the in-plane thickness distribution at the initial formation stage of the first layer may be a major factor that determines the in-plane thickness distribution of the first layer that is finally obtained. Therefore, the above-described effect is very important from the viewpoint of enhancing the controllability of the in-plane film thickness distribution of the SiN film formed on the wafer 200.

By lowering the partial pressure of the HCDS gas in step A1 as described above, it becomes possible to improve a step coverage (step coverage characteristic) of the first layer formed in step A1. This makes it possible to improve the step coverage characteristic of the SiN film formed on the wafer 200.

(e) By starting the supply of the $N_2$ gas from the nozzle 249a prior to the supply of the HCDS gas in step A1, the above-described effect of causing the $N_2$ gas supplied from the nozzle 249a to act as a carrier gas can be reliably obtained immediately after starting the supply of the HCDS gas. In addition, it is possible to prevent the concentration of the HCDS gas from transiently varying in the plane of the wafer 200 at the time of starting the supply of the HCDS gas. As a result, the in-plane thickness distribution of the first layer formed in step A1 can be stably controlled with enhanced reproducibility. As described above, the in-plane thickness distribution at the initial formation stage of the first layer may be a major factor that determines the in-plane thickness distribution of the first layer that is finally obtained. Therefore, the above-described effect is very important from the viewpoint of stably controlling the in-plane film thickness distribution of the SiN film formed on the wafer 200 with enhanced reproducibility.

(f) By arranging the nozzles 249b and 249c at both sides of the nozzle 249a so as to sandwich the nozzle 249a, it is possible to enhance the controllability of the in-plane thickness distribution of the first layer, namely the controllability of the in-plane film thickness distribution of the SiN film formed on the wafer 200.

(g) By disposing the nozzles 249a to 249c so as to face the exhaust port 231a, it is possible to enhance the controllability of the in-plane thickness distribution of the first layer, namely the controllability of the in-plane film thickness distribution of the SiN film formed on the wafer 200.

(h) The above-described effects can be obtained similarly even in the case of using a precursor other than the HCDS gas, a reactant other than the $NH_3$ gas, or an inert gas other than the $N_2$ gas.

(4) Modifications

The film-forming step in the present embodiment is not limited to the aspect shown in FIG. 4, but may be modified as in the following modifications. Further, these modifications may be arbitrarily combined with each other. Unless specifically mentioned otherwise, process sequences and process conditions in respective steps of each of the modifications are the same as the process sequences and the process conditions in the respective steps of the above-described substrate processing sequence.

(Modification 1)

In the film-forming sequence shown in FIG. 4, there has been described the example in which, in step A1, the supply of the $N_2$ gas from the nozzle 249a is started prior to the supply of the HCDS gas. However, the supply of the $N_2$ gas from the nozzle 249a may be started simultaneously with the supply of the HCDS gas. In this case, as compared with the film-forming sequence shown in FIG. 4, it is possible to shorten the process time per cycle and to improve the productivity of the film-forming process.

However, in such a case, the concentration of the HCDS gas in the plane of the wafer 200 may transiently vary at the time of starting the supply of the HCDS gas, which may affect the in-plane thickness distribution of the first layer. Therefore, in order to stably control the in-plane thickness distribution of the first layer formed on the wafer 200 in the period $T_1$ with enhanced reproducibility, as shown in FIG. 4, the supply of the $N_2$ gas from the nozzle 249a may be started prior to the supply of the HCDS gas in step A1.

(Modification 2)

In the film-forming sequence shown in FIG. 4, there has been described the example in which, in step A2, the fourth flow rate is set to be equal to the second flow rate (the fourth flow rate=the second flow rate). However, the fourth flow rate may be set to be smaller than the second flow rate (the fourth flow rate<the second flow rate). Furthermore, the fourth flow rate may be set to zero, and the supply of the $N_2$ gas from the nozzles 249b and 249c may be stopped. Alternatively, the fourth flow rate may be made larger than the second flow rate (the fourth flow rate>the second flow rate).

If the fourth flow rate is made smaller than the second flow rate in step A2, it is possible to finely adjust the in-plane film thickness distribution of the SiN film formed on the wafer 200, for example, in such a direction as to weaken the degree of the center convex distribution. Further, if the fourth flow rate is set to zero in step A2, it is possible to finely adjust the in-plane film thickness distribution of the SiN film formed on the wafer 200, for example, in such a direction as to further weaken the degree of the center convex distribution. Moreover, if the fourth flow rate is made larger than the second flow rate in step A2, it is possible to finely adjust the in-plane film thickness distribution of the SiN film formed on the wafer 200, for example, in such a direction as to strengthen the degree of the center convex distribution.

In this way, by adjusting the magnitude of the fourth flow rate in step A2, it becomes possible to finely adjust the in-plane film thickness distribution of the SiN film formed on the wafer 200.

(Modification 3)

In the film-forming sequence shown in FIG. 4, there has been described the example in which the supply of the $N_2$ gas from the nozzle 249a is stopped in step A2. However, as described above, the HCDS gas may be supplied while supplying the $N_2$ gas from the nozzle 249a at a third flow rate smaller than the first flow rate and the second flow rate but larger than zero. By doing so, it is possible to finely adjust the in-plane film thickness distribution of the SiN film formed on the wafer 200, for example, in such a direction as to strengthen the degree of the center convex distribution.

(Modification 4)

As the precursor, it may be possible to use, for example, an alkylhalosilane precursor gas such as a 1,1,2,2-tetrachloro-1,2-dimethyldisilane (($CH_3$)$_2Si_2Cl_4$, abbreviation: TCDMDS) gas or the like, or an aminosilane precursor gas such as a trisdimethylaminosilane (Si[N($CH_3$)$_2$]$_3$H, abbreviation: 3DMAS) gas, a bisdiethylaminosilane (SiH$_2$[N($C_2H_5$)$_2$]$_2$, abbreviation: BDEAS) gas or the like.

As the reactant, it may be possible to use, for example, an amine-based gas such as a triethylamine (($C_2H_5$)$_3$N, abbreviation: TEA) gas or the like, an O-containing gas (oxidizing agent) such as an oxygen ($O_2$) gas, a water vapor ($H_2O$), an ozone ($O_3$) gas, a plasma-excited $O_2$ gas ($O_2$*), a combination of an $O_2$ gas and a hydrogen ($H_2$) gas or the like, a C-containing gas such as a propylene ($C_3H_6$) gas or the like, or a B-containing gas such as a trichloroborane ($BCl_3$) gas or the like.

For example, according to the following film-forming sequences, a silicon oxynitride film (SiON film), a silicon oxycarbonitride film (SiOCN film), a silicon oxycarbide film (SiOC film), a silicon carbonitride film (SiCN film), a silicon boron carbonitride film (SiBCN film), a silicon boron nitride film (SiBN film) and a silicon oxide film (SiO film) may be formed on the wafer 200.

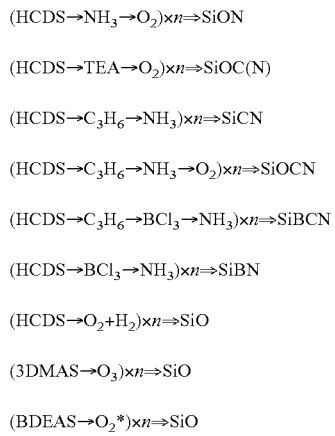

In these film-forming sequences, at the time of supplying the precursor, steps A1 and A2 are performed in the same manner as the film-forming sequence shown in FIG. 4 or the modifications described above, whereby the same effects as described above are obtained. The process sequences and process conditions when supplying the precursor or the reactant may be the same as those of the film-forming sequence shown in FIG. 4 or the film-forming sequence of each of the modifications described above.

Other Embodiments

The embodiment of the present disclosure has been concretely described above. However, the present disclosure is not limited to the above-described embodiment. Various modifications may be made without departing from the spirit of the present disclosure.

In the above-described embodiment, there has been described the example in which the second supply part includes the nozzles 249b and 249c which are disposed at both sides of the nozzle 249a as the first supply part so as to sandwich the nozzle 249a. However, the present disclosure is not limited to such an aspect. For example, the second supply part may include the nozzle 249b alone, and the nozzle 249b may be disposed close to or apart from the nozzle 249a. Even in this case, the same effects as described above can be obtained by performing steps A1 and A2 in the same manner as the film-forming sequence shown in FIG. 4 and each of the above-described modifications at the time of supplying the precursor. However, the nozzle arrangement in the above-described embodiment may be employed from the viewpoint of improving the controllability of the in-plane film thickness distribution of the film formed on the wafer 200.

In the above-described embodiment, there has been described the example in which steps A1 and A2 are performed at the time of supplying the precursor. However, the present disclosure is not limited to such an aspect. For example, steps A1 and A2 may be performed at the time of supplying the reactant rather than at the time of supplying the HCDS gas. In this case, it is possible to control the concentration distribution of N, C, O, B and the like in the film formed on the wafer 200 in the plane of the wafer 200. Steps A1 and A2 performed at the time of supplying the reactant may be performed under the same process conditions and process sequences as those of the film-forming sequence shown in FIG. 4 or steps A1 and A2 shown in each of the above-described modifications.

In the above-described embodiment, there has been described the example in which the reactant such as an $NH_3$ gas or the like is supplied from the nozzle 249b. However, the present disclosure is not limited to such an aspect. For example, the reactant may be supplied from both the nozzles 249b and 249c. Furthermore, nozzles different from the nozzles 249a to 249c may be additionally installed the process chamber 201. The reactant may be supplied using the additional nozzles. Even in these cases, the same effects as described above can be obtained by performing steps A1 and A2 in the same manner as the film-forming sequence shown in FIG. 4 and each of the above-described modifications at the time of supplying the precursor.

In the above-described embodiment, there has been described the example in which the film containing Si as a main element is formed on the substrate. However, the present disclosure is not limited to such an aspect. That is to say, the present disclosure may be suitably applied to a case where a film containing not only Si but also a semimetal element such as germanium (Ge), boron (B) or the like as a main element is formed on the substrate. The present disclosure may also be suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like as a main element is formed on the substrate.

The present disclosure may be suitably applied to, for example, a case where, by using a titanium tetrachloride ($TiCl_4$) gas or a trimethylaluminum (Al($CH_3$)$_3$, abbreviation: TMA) gas as a precursor, a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO film) or the like is formed on a substrate according to the following film-forming sequences.

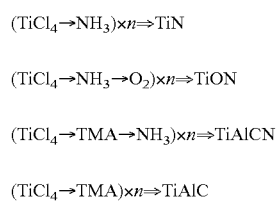

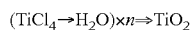

The recipes used for the substrate process may be individually prepared according to the process contents and stored in the memory device 121c via the electric communication line or the external memory device 123. When starting a process, the CPU 121a may appropriately select an appropriate recipe from the plurality of recipes stored in the memory device 121c according to the contents of the substrate process. This makes it possible to form films of various film types, composition ratios, film qualities and film thicknesses with enhanced reproducibility by a single substrate processing apparatus. It is also possible to reduce the burden on an operator and to quickly start the process while avoiding operation errors.

The above-described recipes are not limited to the case of newly creating them, but may be prepared by, for example, changing the existing recipes already installed on the substrate processing apparatus. In the case of changing the recipes, the changed recipes may be installed on the substrate processing apparatus via an electric communication line or a recording medium in which the recipes are recorded. In addition, by operating the input/output device 122 provided in the existing substrate processing apparatus, the existing recipes already installed on the substrate processing apparatus may be directly changed.

Figure 6A:
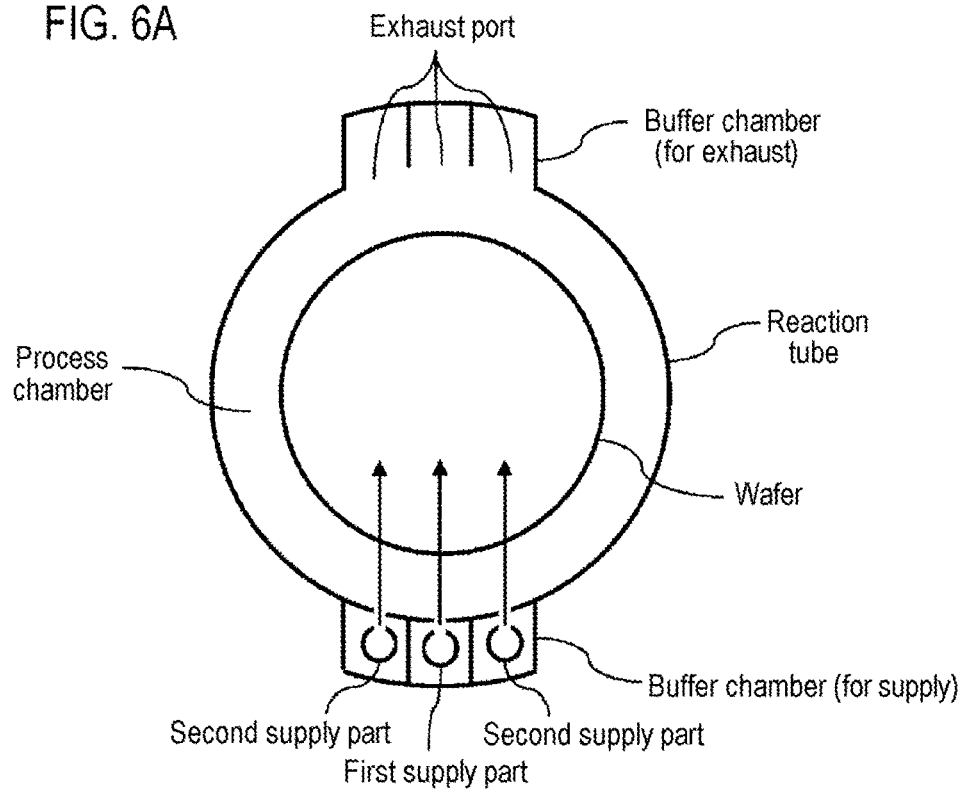
FIGS. 6A and 6B are horizontal sectional views showing modifications of a vertical process furnace, respectively, in which a reaction tube, a buffer chamber, a nozzle and the like are shown in a partially extracted state.
Figure 6B:
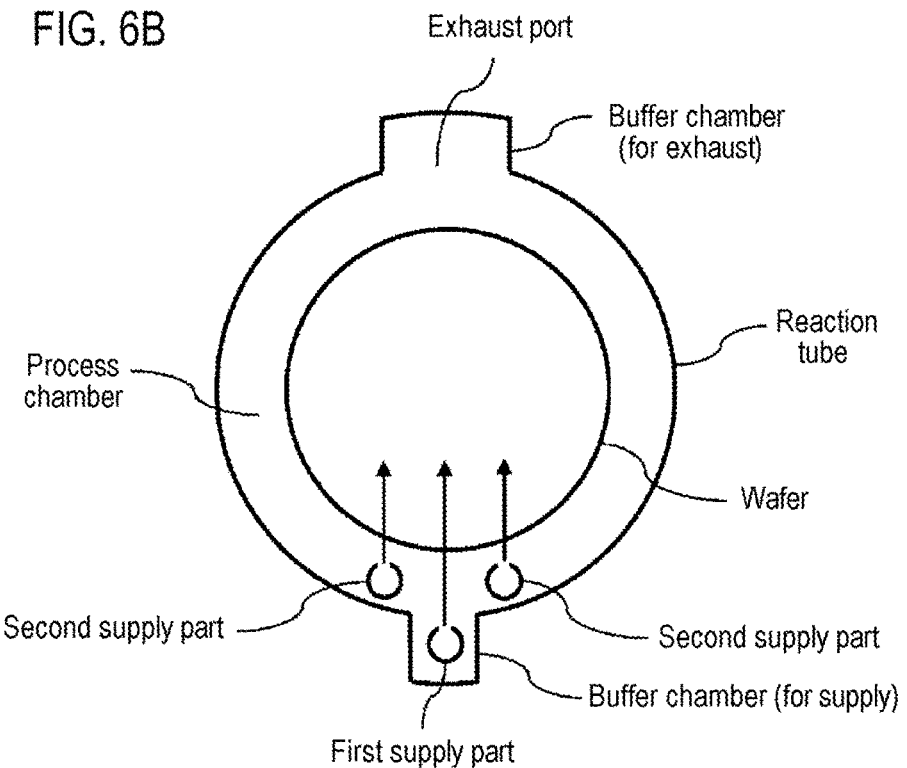

In the above-described embodiment, there has been described the example in which the first and second supply parts are installed inside the process chamber so as to extend along the inner wall of the reaction tube. However, the present disclosure is not limited to the embodiment described above. For example, as can be noted from a cross-sectional structure of a vertical process furnace shown in FIG. 6A, a buffer chamber may be installed in the side wall of the reaction tube, and first and second supply parts having the same configuration as in the above-described embodiment may be arranged in the same arrangement as in the above-described embodiment. In FIG. 6A, there is shown an example where a supply-purpose buffer chamber and an exhaust-purpose buffer chamber are installed in the side wall of the reaction tube and are disposed at positions facing each other across the wafers. Each of the supply-purpose buffer chamber and the exhaust-purpose buffer chamber is installed from the lower portion to the upper portion of the reaction tube, i.e., along the wafer arrangement region. In addition, FIG. 6A shows an example where the supply-purpose buffer chamber is partitioned into a plurality of (three) spaces, and individual nozzles are disposed in the respective spaces. The arrangement of the three spaces of the supply-purpose buffer chamber is the same as the arrangement of the first and second supply parts. Furthermore, for example, as can be noted from a cross-sectional structure of a vertical process furnace shown in FIG. 6B, a buffer chamber may be provided in the same arrangement as in FIG. 6A, a first supply part may be provided in the buffer chamber, and a second supply part may be provided so as to sandwich a communication portion of the buffer chamber with the process chamber from both sides thereof and so as to extend along the inner wall of the reaction tube. Configurations other than the buffer chamber and the reaction tube described with reference to FIGS. 6A and 6B are the same as those of the components of the process furnace shown in FIG. 1. Even when these process furnaces are used, the same effects as those of the above-described embodiment can be obtained.

In the aforementioned embodiments, there has been described an example in which films are formed using a batch-type vertical substrate processing apparatus configured to process a plurality of substrates at a time. The present disclosure is not limited thereto but may be appropriately applied to, for example, a case where films are formed using a single-substrate-type substrate processing apparatus configured to process a single substrate or several substrates at a time. In addition, in the aforementioned embodiments, there has been described an example in which films are formed using a substrate processing apparatus provided with a hot-wall-type processing furnace. The present disclosure is not limited thereto but may be appropriately applied to a case where films are formed using a substrate processing apparatus provided with a cold-wall-type processing furnace.

Even in the case of using these substrate processing apparatuses, film formation may be performed under the same sequences and process conditions as those of the above-described embodiment and modifications, and the same effects as described above can be obtained.

Further, the above-described embodiment and modifications may be used in combination as appropriate. Process sequences and process conditions used at this time may be the same as, for example, the process sequences and process conditions of the above-described embodiment.

The SiN film or the like formed by the methods of above-described embodiment and modifications may be widely used as an insulating film, a spacer film, a mask film, a charge storage film, a stress control film, or the like. In recent years, along with the miniaturization of semiconductor devices, the requirement for in-plane film thickness uniformity on films formed on wafers has become severe. It is considered that the present disclosure capable of forming a film having a flat distribution on a patterned wafer on which a high density pattern is formed is very useful as a technique for complying with this requirement.

Examples

Hereinafter, experimental results that support the effects obtained in the above-described embodiment will be described.

In Examples 1 to 3, using the substrate processing apparatus shown in FIG. 1, SiN films were respectively formed on a plurality of wafers according to the film-forming sequence shown in FIG. 4. In Examples 1 to 3, in step A1, the flow rate (first flow rate) of the $N_2$ gas supplied from a single nozzle as the first supply part was set to 10 slm, and the total flow rate (second flow rate) of the $N_2$ gases supplied from two nozzles as the second supply part was set to 1 slm (0.5 slm×2), 4 slm (2 slm×2) and 10 slm (5 slm×2) in order. In step A2, the supply of the $N_2$ gas from the single nozzle as the first supply part was stopped, and the total flow rate (fourth flow rate) of the $N_2$ gas supplied from the two nozzles as the second supply part was set to the same flow rate as the second flow rate. Other process conditions were set to predetermined conditions falling within the process condition range described in the above embodiment.

In Comparative examples 1 to 3, using the substrate processing apparatus shown in FIG. 1, a cycle of non-simultaneously performing a step of supplying a HCDS gas to a wafer and a step of supplying an $NH_3$ gas to a wafer was performed a predetermined number of times to form a SiN film on a plurality of wafers. In these Comparative examples, steps A1 and A2 were not performed, and the supply of the $N_2$ gas from the first supply part and the second supply part was controlled as follows. That is to say, in Comparative examples 1 and 2, in the step of supplying the HCDS gas to the wafer, the supply of the $N_2$ gas from the single nozzle as the first supply part was stopped and the total flow rate of the $N_2$ gas supplied from the two nozzles as the second supply part was set to 0.2 slm (0.1 slm×2) and 10 slm (5 slm×2) in order. In Comparative example 3, in the step of supplying the HCDS gas to the wafer, the flow rate of the $N_2$ gas supplied from the single nozzle as the first supply part was set to 10 slm, and the total flow rate of the $N_2$ gas supplied from the two nozzles as the second supply part was set to 0.2 slm (0.1 slm×2). Other process conditions were the same as the process conditions in the examples.

Figure 7A:
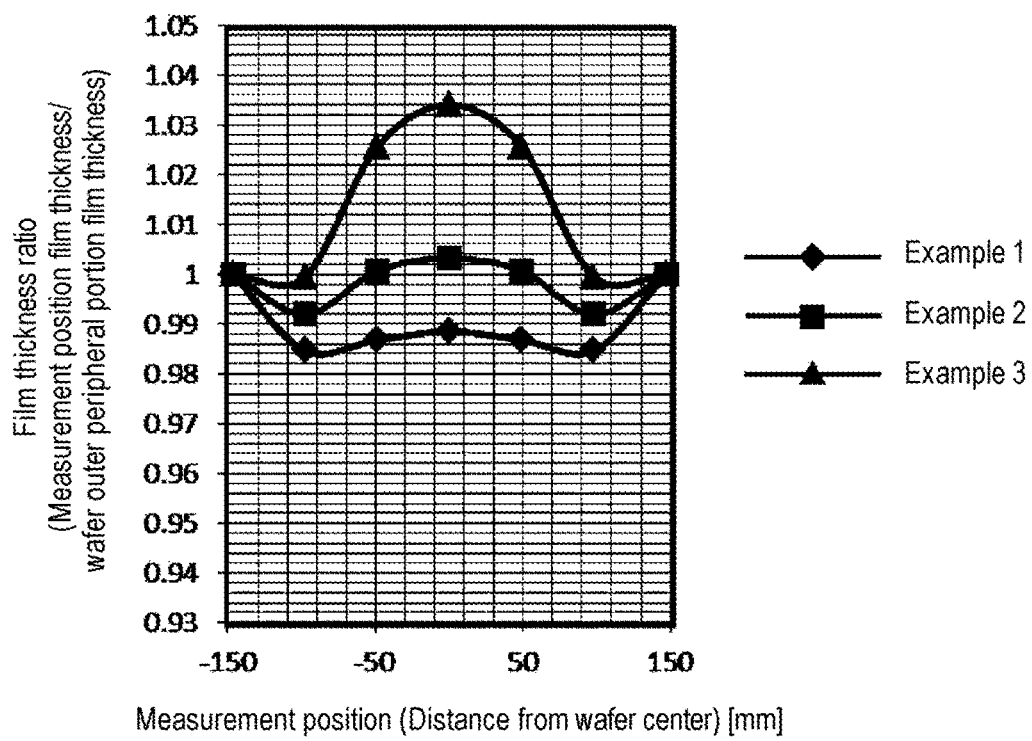
FIG. 7A is a diagram showing the evaluation results of a substrate in-plane film thickness distribution in Examples.
Figure 7B:
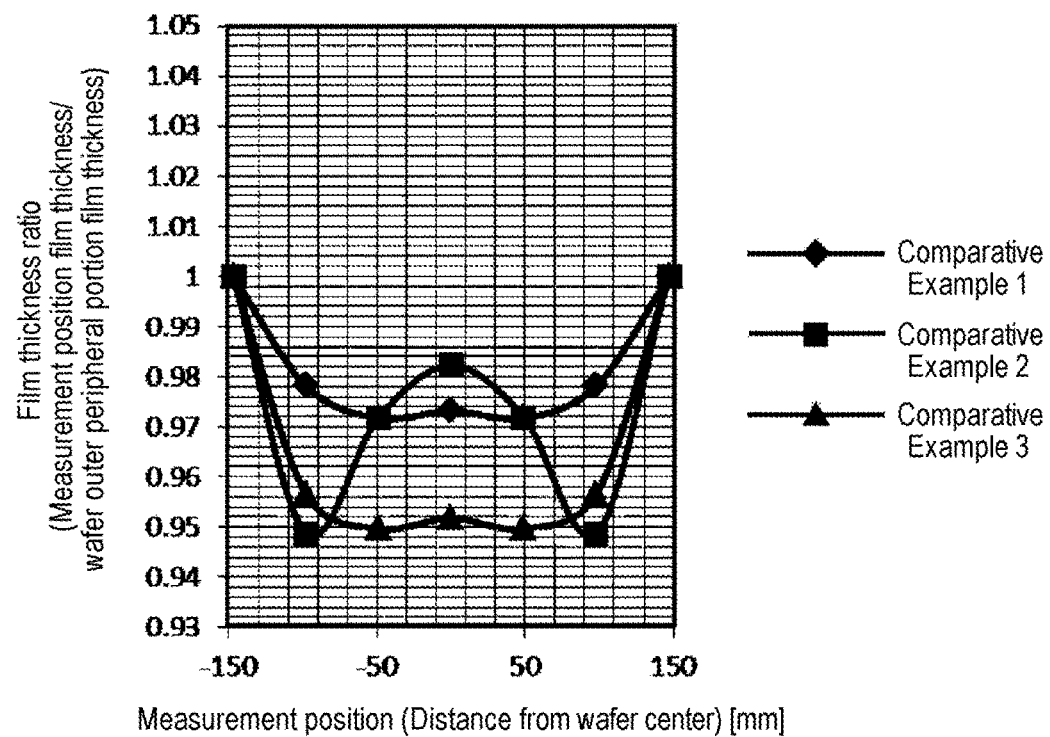
FIG. 7B is a diagram showing the evaluation results of a substrate in-substrate film thickness distribution in Comparative Examples.

The in-plane film thickness distributions of the SiN films formed in Examples 1 to 3 and Comparative examples 1 to 3 were measured. FIGS. 7A and 7B show the measurement results. Each of the vertical axis in FIGS. 7A and 7B represents the ratio of the film thickness of the SiN film at the measurement position to the film thickness of the SiN film at the outer peripheral portion of the wafer (film thickness at measurement position/film thickness at wafer outer peripheral portion). Each of the horizontal axis in FIGS. 7A and 7B represents the distance [mm] from the center of the wafer at the measurement position. The symbols ♦, ■, ▲ in FIG. 7A indicate the measurement results in Examples 1 to 3, respectively, and the symbols ♦, ■, ▲ in FIG. 7B indicate the measurement results in Comparative examples 1 to 3, respectively.

According to FIG. 7A, it can be noted that the in-plane film thickness distribution of the SiN film in Example 3 becomes a strong center convex distribution, and the degree of the center convex distribution weakens in the order of Examples 2 and 1. That is to say, in step A1, by adjusting the second flow rate between a relatively large flow rate and a relatively small flow rate in a state in which the first flow rate is set to a relatively large flow rate, it is possible to control the in-plane film thickness distribution over a wide range, for example, to strengthen or weaken the degree of the center convex distribution of the in-plane film thickness distribution of the SiN film formed on the wafer.

According to FIG. 7B, it can be noted that the in-plane film thickness distributions of the SiN films in Comparative examples 1 to 3 do not become a center convex distribution. In all Comparative examples, the film thickness tends to become thickest at the outer peripheral portion. The degree of the center concave distribution is very strong in some comparative examples. It can be seen that, in the film-forming method used in Comparative examples 1 to 3, it is difficult to control the in-plane film thickness distribution of the SiN film formed on the wafer to become, for example, a flat distribution or a center convex distribution.

According to the present disclosure in some embodiments, it is possible to control a substrate in-pane film thickness distribution of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a film on a substrate by performing a cycle a predetermined number of times, the cycle including non-simultaneously performing:
   (a) forming a first layer by supplying a precursor to the substrate; and
   (b) forming a second layer by supplying a reactant to the substrate and modifying the first layer,
   wherein (a) includes: (a-1) supplying the precursor so as to pass over a first portion of the substrate from a first supply part while supplying an inert gas so as to pass over the first portion of the substrate at a first flow rate from the first supply part, and supplying an inert gas so as to pass over a second portion of the substrate at a second flow rate from a second supply part different from the first supply part; and subsequently, (a-2) supplying the precursor so as to pass over the first portion of the substrate from the first supply part while supplying the inert gas so as to pass over the first portion of the substrate at a third flow rate smaller than each of the first flow rate and the second flow rate from the first supply part, or supplying the precursor so as to pass over the first portion of the substrate from the first supply part while stopping the supply of the inert gas so as to pass over the first portion of the substrate from the first supply part, and supplying the inert gas so as to pass over the second portion of the substrate at a fourth flow rate from the second supply part,
   wherein the first portion is a central portion of the substrate,
   wherein the second portion is different from the first portion, and
   wherein the second flow rate is different from the first flow rate and the fourth flow rate is different from the third flow rate.

2. The method of claim 1, wherein an execution time of (a-1) is set to be shorter than an execution time of (a-2).

3. The method of claim 1, wherein a partial pressure of the precursor in (a-1) is set to be lower than a partial pressure of the precursor in (a-2).

4. The method of claim 1, wherein (a-1) is executed during a period, in which an adsorption state of a main element constituting the film, which is contained in the precursor, is kept in a pseudo-unsaturated state.

5. The method of claim 1, wherein (a-2) is executed during a period, in which an adsorption state of a main element constituting the film, which is contained in the precursor, is kept in a pseudo-saturated state.

6. The method of claim 1, wherein (a-1) is executed for a period until a formation rate of the first layer is changed from a first rate to a second rate smaller than the first rate.

7. The method of claim 1, wherein (a-2) is executed for a period after a formation rate of the first layer is changed from a first rate to a second rate smaller than the first rate.

8. The method of claim 1, wherein an amount of the precursor reaching the central portion of the substrate in (a-1) is set to be larger than an amount of the precursor reaching the central portion of the substrate in (a-2).

9. The method of claim 1, wherein in (a-1), an amount of the precursor reaching the central portion of the substrate is set to be larger than an amount of the precursor reaching an outer peripheral portion of the substrate.

10. The method of claim 1, wherein a concentration of the precursor at the central portion of the substrate in (a-1) is set to be higher than a concentration of the precursor at the central portion of the substrate in (a-2).

11. The method of claim 1, wherein in (a-1), a concentration of the precursor at the central portion of the substrate is set to be higher than a concentration of the precursor at an outer peripheral portion of the substrate.

12. The method of claim 1, wherein a film thickness distribution of the film formed on the substrate in a plane of the substrate is finely adjusted by adjusting the fourth flow rate.

13. The method of claim 1, wherein in (a-1), the supply of the inert gas from the first supply part is started prior to the supply of the precursor.

14. The method of claim 1, wherein the second supply part includes a plurality of supply parts disposed at both sides of the first supply part so as to sandwich the first supply part.

15. The method of claim 1, wherein each of the first flow rate and the second flow rate is set to be larger than a supply flow rate of the precursor in (a-1).

16. The method of claim 1, wherein the fourth flow rate is set to be larger than a supply flow rate of the precursor in (a-2).

17. The method of claim 1, wherein the third flow rate is set to be smaller than a supply flow rate of the precursor in (a-2).

18. The method of claim 1, wherein in (a-2), the supply of the inert gas from the first supply part is stopped and the third flow rate is set to zero.

19. The method of claim 1, wherein the third flow rate is set to be smaller than the fourth flow rate.

20. A method of processing a substrate, comprising:
forming a film on a substrate by performing a cycle a predetermined number of times, the cycle including non-simultaneously performing:
(a) forming a first layer by supplying a precursor to the substrate; and
(b) forming a second layer by supplying a reactant to the substrate and modifying the first layer,
wherein (a) includes: (a-1) supplying the precursor so as to pass over a first portion of the substrate from a first supply part while supplying an inert gas so as to pass over the first portion of the substrate at a first flow rate from the first supply part, and supplying an inert gas so as to pass over a second portion of the substrate at a second flow rate from a second supply part different from the first supply part; and subsequently, (a-2) supplying the precursor so as to pass over the first portion of the substrate from the first supply part while supplying the inert gas so as to pass over the first portion of the substrate at a third flow rate smaller than each of the first flow rate and the second flow rate from the first supply part, or supplying the precursor so as to pass over the first portion of the substrate from the first supply part while stopping the supply of the inert gas so as to pass over the first portion of the substrate from the first supply part, and supplying the inert gas so as to pass over the second portion of the substrate at a fourth flow rate from the second supply part,
wherein the first portion is a central portion of the substrate,
wherein the second portion is different from the first portion, and
wherein the second flow rate is different from the first flow rate and the fourth flow rate is different from the third flow rate.

21. A substrate processing apparatus, comprising:
a process chamber in which a substrate is processed;
a precursor supply system configured to supply a precursor to the substrate inside the process chamber;
a reactant supply system configured to supply a reactant to the substrate inside the process chamber;
an inert gas supply system configured to supply an inert gas to the substrate inside the process chamber; and
a controller configured to control the precursor supply system, the reactant supply system and the inert gas supply system so as to perform, inside the process chamber,
forming a film on the substrate by performing a cycle a predetermined number of times, the cycle including non-simultaneously performing:
(a) forming a first layer by supplying the precursor to the substrate; and
(b) forming a second layer by supplying the reactant to the substrate and modifying the first layer,
wherein (a) includes: (a-1) supplying the precursor so as to pass over a first portion of the substrate from a first supply part while supplying an inert gas so as to pass over the first portion of the substrate at a first flow rate from the first supply part, and supplying an inert gas so as to pass over a second portion of the substrate at a second flow rate from a second supply part different from the first supply part; and subsequently, (a-2) supplying the precursor so as to pass over the first portion of the substrate from the first supply part while supplying the inert gas so as to pass over the first portion of the substrate at a third flow rate smaller than each of the first flow rate and the second flow rate from the first supply part, or supplying the precursor so as to pass over the first portion of the substrate from the first supply part while stopping the supply of the inert gas so as to pass over the first portion of the substrate from the first supply part, and supplying the inert gas so as to pass over the second portion of the substrate at a fourth flow rate from the second supply part,
wherein the first portion is a central portion of the substrate,
wherein the second portion is different from the first portion, and
wherein the second flow rate is different from the first flow rate and the fourth flow rate is different from the third flow rate.

22. A non-transitory computer-readable recording medium storing a program that causes, by a computer, a substrate processing apparatus to perform a process in a process chamber of the substrate processing apparatus, the process comprising:
forming a film on a substrate by performing a cycle a predetermined number of times, the cycle including non-simultaneously performing:
(a) forming a first layer by supplying a precursor to the substrate; and
(b) forming a second layer by supplying a reactant to the substrate and modifying the first layer,
wherein (a) includes: (a-1) supplying the precursor so as to pass over a first portion of the substrate from a first supply part while supplying an inert gas so as to pass over the first portion of the substrate at a first flow rate from the first supply part, and supplying an inert gas so as to pass over a second portion of the substrate at a second flow rate from a second supply part different from the first supply part; and subsequently, (a-2) supplying the precursor so as to pass over the first portion of the substrate from the first supply part while supplying the inert gas so as to pass over the first portion of the substrate at a third flow rate smaller than each of the first flow rate and the second flow rate from the first supply part, or supplying the precursor so as to pass over the first portion of the substrate from the first supply part while stopping the supply of the inert gas so as to pass over the first portion of the substrate from the first supply part, and supplying the inert gas so as to pass over the second portion of the substrate at a fourth flow rate from the second supply part, wherein the first portion is a central portion of the substrate, wherein the second portion is different from the first portion, and wherein the second flow rate is different from the first flow rate and the fourth flow rate is different from the third flow rate.

\* \* \* \* \*